United States Patent [19]

Ogawara

[11] Patent Number: 5,162,800
[45] Date of Patent: Nov. 10, 1992

[54] DIGITAL-TO-ANALOG CONVERTING UNIT WITH IMPROVED LINEARITY

[75] Inventor: Takeshi Ogawara, Tokyo, Japan

[73] Assignee: NEC Corporation, Tokyo, Japan

[21] Appl. No.: 776,197

[22] Filed: Oct. 15, 1991

[30] Foreign Application Priority Data

Oct. 26, 1990 [JP] Japan ................................. 2-288918

[51] Int. Cl.⁵ ............................................ H03M 1/66
[52] U.S. Cl. ................................................ 341/144
[58] Field of Search ............... 341/136, 144, 148, 118, 341/153, 133; 323/270, 271, 312, 269, 303; 307/449

[56] References Cited

U.S. PATENT DOCUMENTS

4,695,826  9/1987  Ando et al. ........................ 341/144
4,859,930  8/1989  Schouwenaars et al. ......... 323/317

*Primary Examiner*—A. D. Pellinen
*Assistant Examiner*—B. K. Young

[57] ABSTRACT

A digital-to-analog converting unit decodes a digital input signal into a decoded signal, and selectively allows constant-current cells arranged in matrix to supply unit currents for producing an analog output signal, wherein a decoding circuit incorporated in the digital-to-analog converting unit sequentially selects the constant-current cells in such a manner that insufficient increment of current produced by one of the constant-current-cells cancels out excessive increment of current produced by another constant-current cell so that the analog output signal is improved in linearity.

6 Claims, 4 Drawing Sheets

DIGITAL-TO-ANALOG CONVERTING UNIT WITH IMPROVED LINEARITY

FIELD OF THE INVENTION

This invention relates to a digital-to-analog converting unit and, more particularly, to a decoding circuit for improving linearity of an analog output signal.

DESCRIPTION OF THE RELATED ART

A typical example of the digital-to-analog converting unit is illustrated in FIG. 1 of the drawings, and has input terminals T1, T2, Tm, Tm+1, Tm+2, ... and Tn where an n-bit input digital signal is applied. The input digital signal is split into two parts, and the two parts are respectively transferred to decoding circuits 1a and 1b. The decoding circuits 1a and 1b respectively decodes the two parts of the input digital signal into digital codes, respectively, and the digital codes are temporarily stored in latching circuits 2a and 2b, and is, in turn, supplied to a constant-current cell array 3. The constant-current cell array 3 is implemented by $2^n-1$ constant-current cells arranged in p rows and m columns, and each of the constant-current cells allow a unit current to flow therethrough. With the digital codes, the constant-current cell array 3 selectively switches the constant-current cells so that current equivalent to the value represented by the digital input signal flows into an output terminal Tout. The current flowing into the output terminal Tout forms an analog output signal.

For better understanding of the prior art digital-to-analog conversion, description is made on a simplified decoding circuit 4 shown in FIG. 2. Although the simplified decoding circuit 4 is responsive to 3-bit digital input signal applied to input terminals In1, IN2 and IN3, the description on the simplified decoding circuit 4 is applicable to the decoding circuits 1a and 1b. The simplified decoding circuit 4 comprises four 2-input OR gates 4a to 4d, four 2-input AND gates 4e to 4g, a 2-input AND gate 4h and two 2-input OR gates 4i and 4j, and decodes a 3-bit digital input signal supplied to the input terminals IN1 to IN3 into a 7-bit digital decoded signal (D6 D5 D4 D3 D2 D1 D0). The bit pattern of the digital decoded signal is symmetrical with respect to the bit D3, and selectively switches the constant-current cells 5a, 5b, 5c, 5d, 5e, 5f and 5g in a row to be selected by another decoding circuit. When the digital input signal is (0 0 1), only the constant-current cell 5d is selected by the decoding unit 4. The selected constant-current cells 5a to 5g are alternately increased on both sides of the constant-current cell 5d with the value indicated by the digital input signal. Table 1 shows the relation between the digital input signal supplied to the input terminals IN1 to IN3 and the selected constant-current cells 5a to 5g, and "*" stands for the constant-current cell or cells to be selected.

TABLE 1

| Input Signal | Constant Current Cells | | | | | | |
|---|---|---|---|---|---|---|---|
| | 5a | 5b | 5c | 5d | 5e | 5f | 5g |
| 001 | | | | * | | | |
| 010 | | | * | * | | | |
| 011 | | | * | * | * | | |
| 100 | | * | * | * | * | | |
| 101 | | * | * | * | * | * | |
| 110 | * | * | * | * | * | * | |
| 111 | * | * | * | * | * | * | * |

In general, the linearity of the analog output signal is dependent upon the accuracy of the constant-current cells 5a to 5g, i.e., uniformity of the unit currents. When the prior art digital-to-analog converting circuit is integrated on a semiconductor substrate, it is necessary to arrange the constant-current cells 5a to 5g as close as possible, because the constant-current cells closer to each other are hardly affected by irregularity of treatments in a fabricating process. However, this approach is not so effective against the non-linearity of the analog output signal, and the prior art digital-to-analog converting unit still encounters a problem in insufficient linearity.

SUMMARY OF THE INVENTION

It is therefore an important object of the present invention to provide a digital-to-analog converting unit which achieves improved linearity of an analog output signal.

The present inventor analyzes the analog output signal as well as the layout of component elements, and concludes that the resistance of the resistive element incorporated in any one of the constant-current cells 5a to 5g is valued with the location thereof. In detail, the constant-current cells 5a to 5g produces the unit currents, and the unit currents are dispersed as shown in FIG. 3. Since the constant-current cells 5a to 5c and 5e to 5g on both sides of the cell 5d are alternately selected by the decoding circuit 4, the constant-current cells 5a to 5c spaces the total amount of current produced by the row of the constant-current cells 5a to 5g from a theoretical line RL upon recovery of the least significant bit to logic "0" level, and the total amount of current traces a zigzag course indicated by broken line BL of FIG. 4.

To accomplish these objects, the present invention proposes to select constant-current cells in such a manner that insufficient increment cancels out excessive increment.

In accordance with the present invention, there is provided a digital-to-analog converting unit comprising a) a plurality of constant-current cells arranged in rows and columns, the plurality of constant-current cells respectively producing unit currents broken down into large currents, standard currents and small currents, and b) decoding means responsive to a digital input signal and selectively allowing the constant-current cells to flow the unit currents in such a manner that one of the large currents and one of the small currents simultaneously flow instead of one of the standard current previously selected upon increment of said digital input signal for linearly increasing the total amount of unit currents forming an analog output signal.

BRIEF DESCRIPTION OF THE DRAWINGS

The features and advantages of the digital-to-analog converting unit according to the present invention will be more clearly understood from the following description taken in conjunction with the accompanying drawings in which.

DESCRIPTION OF THE PREFERRED EMBODIMENT

Figure 5:
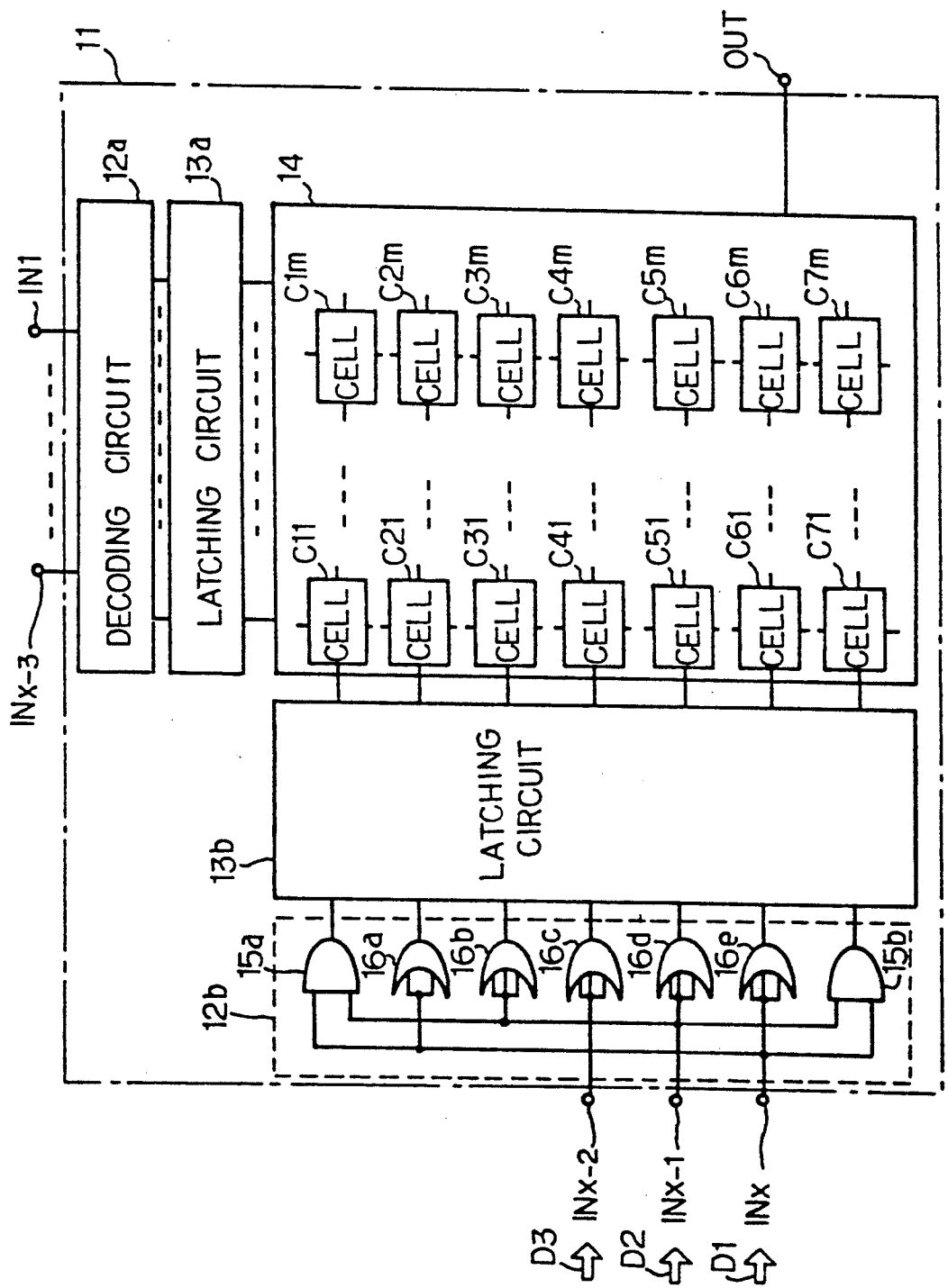
FIG. 5 is a block diagram showing the circuit arrangement of a digital-to-analog converting unit according to the present invention.

Referring to FIG. 5 of the drawings, a digital-to-analog converting unit embodying the present invention is fabricated on a single semiconductor chip 11, and has input terminals IN1, INx−3, INx−2, INx−1 and INx as well as an output terminal OUT. The input terminals IN1 to INx−3 are coupled with a first decoding circuit 12a, and the other input terminals INx−2 to INx are coupled with a second decoding circuit 12b. The first and second decoding circuits 12a and 12b are coupled with latching circuits 13a and 13b, respectively, and, accordingly, first and second decoded signals respectively produced by the first and second decoding circuits 12a and 12b are temporarily stored in the first second latching circuits 13a and 13b, respectively. The first and second latching circuits 13a and 13b are associated with a constant-current cell array 14, and the first and second decoded signals are used for selectively activating a plurality of constant-current cells C11 to C7m forming in combination the constant-current cell array 14. In this instance, the first and second decoding circuits 12a and 12b form in combination decoding means, and first and second latching circuits 13a and 13b as a whole constitute latching means.

Upon activation, the constant-current cells C11 to C7m respectively produce unit currents, and the unit currents are merged with one another for producing an analog output signal at the output terminal OUT. The constant-current cells C11 to C7m are adapted to produce the unit currents equal to one another, however, unavoidable dispersion takes place. The unit currents are broken down into large currents, standard currents and small currents, and each of the large currents is causative of excessive increment of the total amount of current of the analog output signal However, each of the small currents causes the analog output signal to insufficiently increment. In this instance, the constant-current cell C41 produces the standard current, the constant-current cells C11, C21 and C31 produce the large currents, respectively, and the constant-current cells C51, C61 and C71 respectively produce the small currents. The constant-current cells C11, C21, C31, C41, C51, C61 and C71 are hereinbelow referred to the first column.

The second decoding circuit 12b is implemented by two AND gates 15a and 15b and five OR gates 16a, 16b, 16c, 16d and 16e. All of the input nodes of the OR gate 16c are coupled with the input terminal INx−2, and is, accordingly, transparent to a bit D3 of the digital input signal. All of the input nodes of the OR gates 16a and 16e are coupled with the input terminal INx, and, for this reason, the OR gates 16a and 16e respectively produce output bits identical in logic level with a data bit D1 of the digital input signal. Similarly, all of the input nodes of the OR gates 16b and 16d are coupled with the input terminal INx−1 so that output bits thereof are identical in logic level with a data bit D2 of the digital input signal. However, the input terminals INx−1 and INx are coupled in parallel with the input nodes of the AND gate 15a as well as with the input nodes of the AND gate 15b so that the AND gates 15a and 15b yield respective output bits of logic "1" level only when the data bits D1 and D2 are in logic "1" level.

Figure 1:
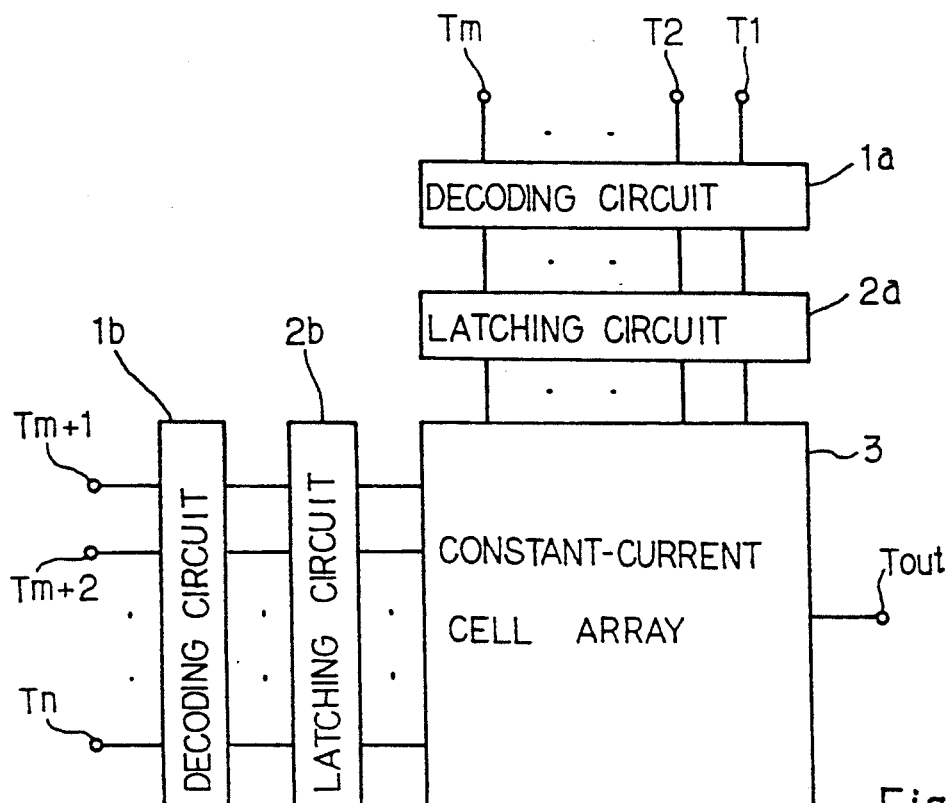
FIG. 1 is a block diagram showing the arrangement of the prior art digital-to-analog converting unit.
Figure 4:
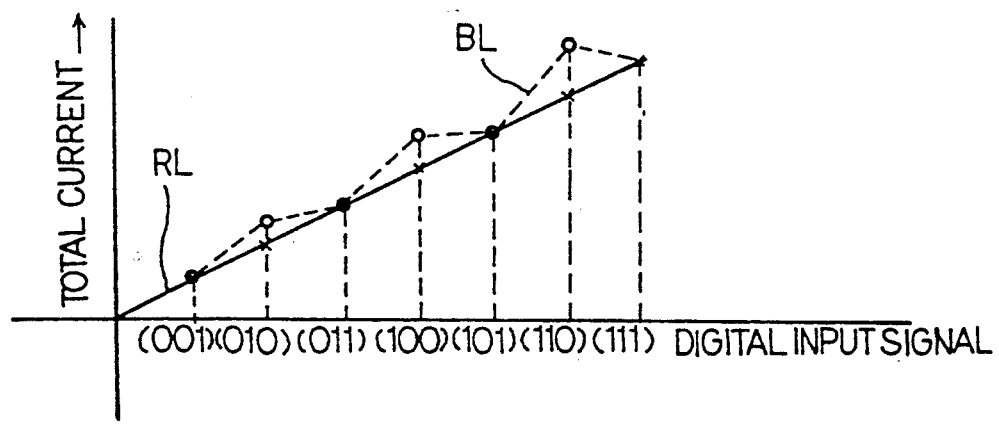
FIG. 4 is a graph showing the total amount of current produced by the constant-current cells in terms of the value represented by the digital input signal supplied to the prior art digital-to-analog converting unit.

Description on circuit behavior is focused upon the second decoding circuit 12b, because the other component circuits 12a, 13a, 13b and 14 are analogous to the corresponding circuits of the digital-to-analog unit shown in FIG. 1. Assuming now that the digital input signal (D1, D2, D3) are logic "0" level, logic "0" level and logic "1" level, only the OR gate 16c yields the output bit of logic "1", and the other gates 15a, 15b, 16a, 16b, 16d and 16e keep the respective output bits in logic "0" level. Therefore, only the constant-current cell C41 is activated in the first column, and the other columns are dependent upon the data bits of the digital input signal applied to the input terminals IN1 to INx−3. For the sake of simplicity, the first decoding circuit 12a is assumed to select the first column only hereinbelow. Since only the constant-current cell C41 produces the standard current, the analog output signal is plotted on the theoretical line RL of FIG. 4.

When the digital input signal is incremented to (D1, D2, D3)=(0 1 0), the OR gate 16c recovers the output bit from logic "1" level to logic "0" level, and the OR gates 16b and 16d yield the respective output bits of logic "1". However, the OR gates 16a and 16e and the AND gates 15a and 15b keep the output bits in logic "0" level, and the constant-current cells C31 and C51 area activated to supply the respective unit currents. The unit current produced by the constant-current cell 16b is of the large current, and the unit current produced by the constant-current cell 16d is of the small current. The insufficient increment of the small current cancels out the excessive increment of the large current, and the total amount of current is substantially as twice large as the standard current. Therefore, the analog output signal is plotted on the theoretical line RL.

When the digital input signal is further incremented to (D1, D2, D3)=(0 1 1), the OR gates 16b to 16d are activated to supply the respective unit currents. The unit current produced by the OR gate 16c is added to the analog output signal equivalent to the digital input signal of (0 1 0), and is of the standard current. Therefore, the analog output signal is also plotted on the theoretical line RL.

Thus, the second decoding circuit 12b sequentially selects the constant-current cells C11 to C71 of the first column in such a manner that a constant current cell for the large current and a constant current cell for the small current are newly activated instead of the constant-current for the standard current previously selected, and Table 2 summarizes the selected constant-current cells C11 to C71 of the first column.

TABLE 2

| Input Signal | | | Constant | | | Current | | | Cells |
|---|---|---|---|---|---|---|---|---|---|
| D1 | D2 | D3 | C11 | C21 | C31 | C41 | C51 | C61 | C71 |
| 0 | 0 | 1 | | | | • | | | |

TABLE 2-continued

| Input Signal | | | Constant | | Current | | | Cells | |
| --- | --- | --- | --- | --- | --- | --- | --- | --- | --- |
| D1 | D2 | D3 | C11 | C21 | C31 | C41 | C51 | C61 | C71 |
| 0 | 1 | 0 |  |  | * |  | * |  |  |
| 0 | 1 | 1 |  |  | * | * | * |  |  |
| 1 | 0 | 0 |  | * | * |  | * | * |  |
| 1 | 0 | 1 |  | * | * | * | * | * |  |
| 1 | 1 | 0 | * | * | * |  | * | * | * |
| 1 | 1 | 1 | * | * | * | * | * | * | * |

Figure 2:
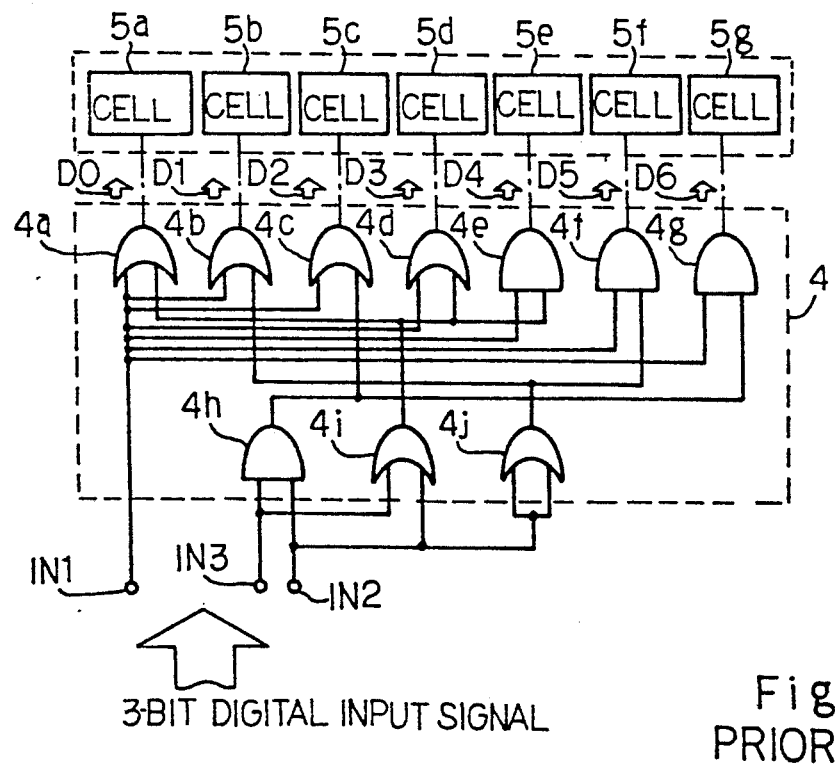
FIG. 2 is a logic diagram showing the arrangement of the simplified prior art decoding circuit incorporated in the digital-to-analog converting unit.
Figure 3:
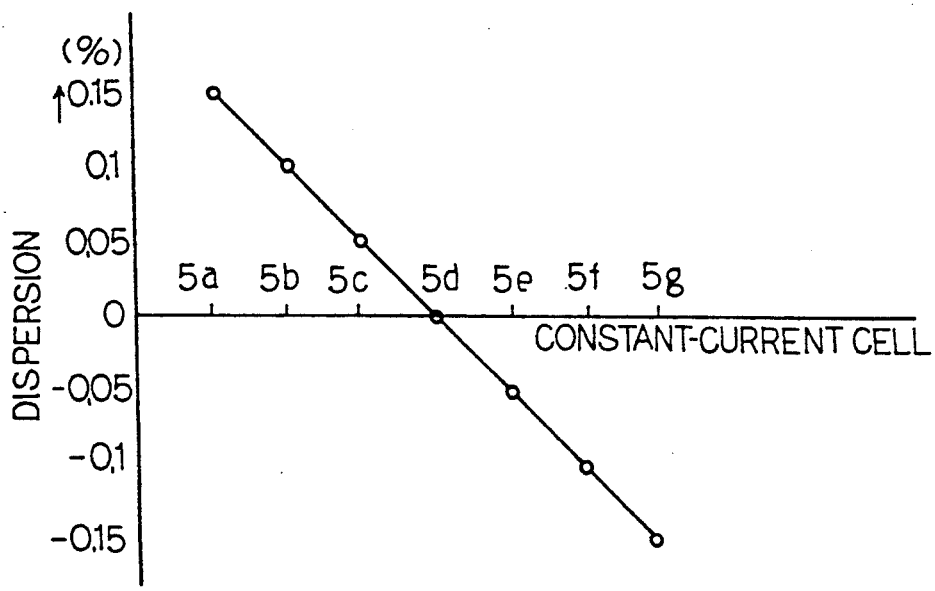
FIG. 3 is a graph showing dispersion of unit current produced by a constant-current cell incorporated in the prior art digital-to-analog converting unit.

While the digital input signal (D1, D2, D3) increments the value from (0 0 1) to (1 1 1), the analog output signal traces the theoretical line RL, and the linearity of the analog output signal is surely improved. Moreover, the second decoding circuit 12b is fabricated from the two AND gates 15a and 15b and the five OR gates 16a to 16e, and, accordingly, the component logic gates are smaller than those of the prior art decoding circuit shown in FIG. 2. This results in high-speed conversion as well as in reduction of current consumption.

In the digital-to-analog converting circuit shown in FIG. 5, each column is implemented by seven constant-current cells such as C11 to C71, and n is seven. For this reason, the constant current cell C41 is located at (n/2) position through round down. However, if each column is an even number of constant-current cells, the second decoding circuit 12b starts from a constant-current cell at {(n/2)+1} position.

Figure 6:
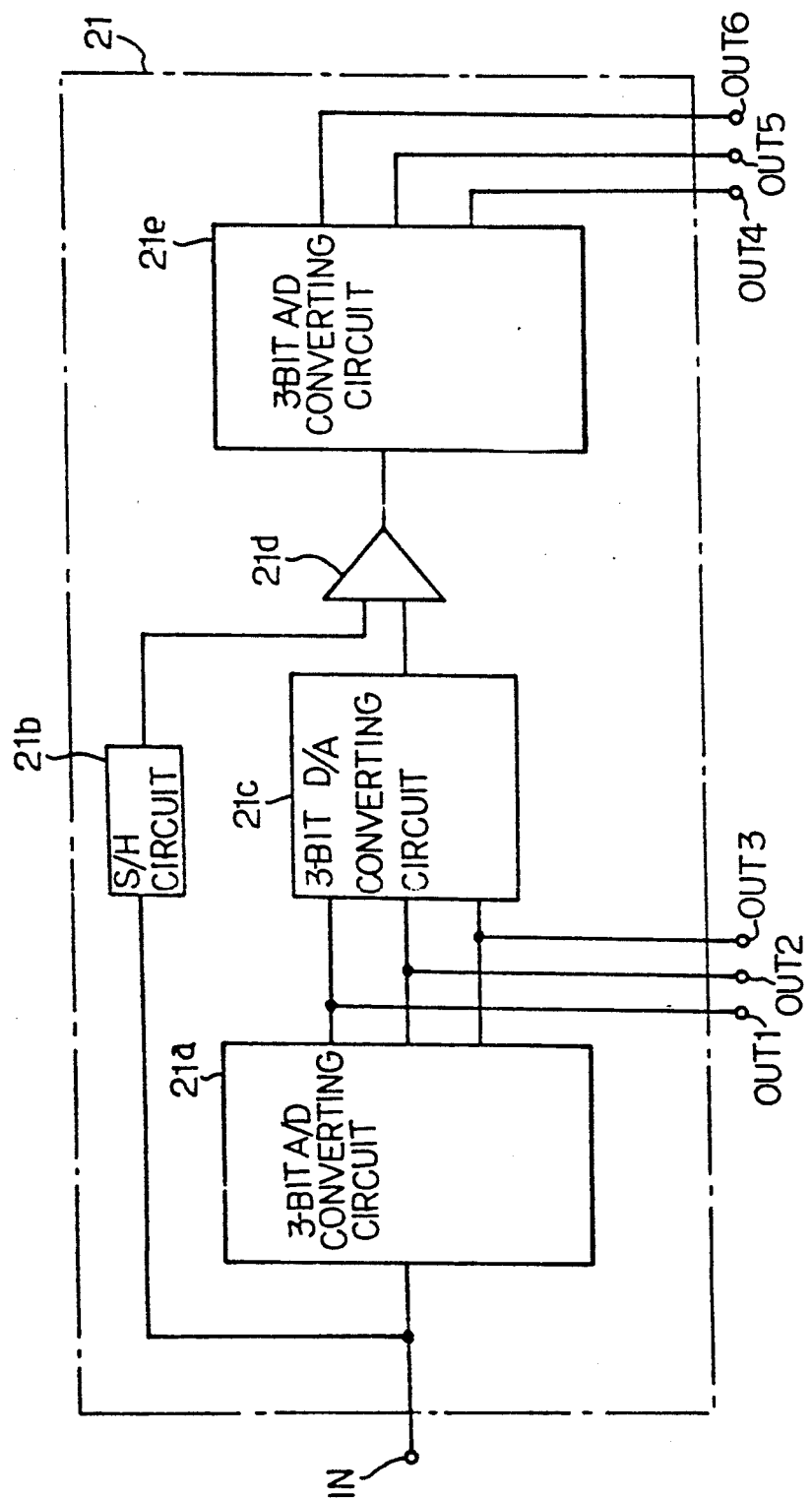
FIG. 6 is a block diagram showing the arrangement of an analog-to-digital converting unit according to the present invention.

Turning to FIG. 6 of the drawings, an analog-to-digital converting unit embodying the present invention is fabricated on a single semiconductor chip 21, and comprises an input terminal IN supplied with an analog input signal, a first 3-bit analog-to-digital converting circuit 21a responsive to the analog input signal for producing a first 3-bit digital output signal, a sample-and-hold circuit 21b coupled with the input terminal IN for producing a sampled signal indicative of a discrete value at the sampling timing, a 3-bit digital-to-analog converting circuit 21c responsive to the first 3-bit digital signal for producing an analog signal, an operational amplifier 21d serving as a subtracter for the voltage signal and the analog signal, and a second 3-bit analog-to-digital converting circuit 21e responsive to the difference signal of the operational amplifier 21d for producing a second 3-bit digital signal. The first and second 3-bit digital signals form in combination a 6-bit digital output signal indicative of the value of the analog input signal, and the 6-bit digital output signal is supplied to output terminals OUT1 to OUT6. The 3-bit digital-to-analog converting circuit 21c is similar in arrangement to the digital to-analog converting circuit shown in FIG. 5 except for the number of input data bits and the other component circuits 21a, 21b, 21d, 21e and 21 are well known to a person skilled in the art. The data bits of the digital signal are distributed within 3-bit D/A converting circuit 21c.

In operation, assuming now that the analog input signal indicative of a certain value is supplied to the input terminal IN, the first 3-bit analog-to-digital converting circuit 21a produces the first 3-bit digital signal roughly indicative of the analog input signal, and the sample-and-hold circuit 21b takes out the discrete voltage level of the analog input signal indicative of the certain value. The first 3-bit digital signal is supplied to the 3-bit digital-to-analog converting circuit 21c, and the 3-bit digital-to-analog converting circuit 21c produces the analog signal strictly equivalent to the first 3-bit digital signal. The operational amplifier 21d subtracter the value indicated by the analog signal from the certain value indicated by the sampled signal. Therefore, the difference signal is indicative of the difference between the certain value and the value indicated by the analog signal. The difference signal is supplied to the second 3-bit analog-to-digital converting circuit 21e, and the difference is converted into the second 3-bit digital signal. Since the analog input signal is converted into the 6-bit digital output signal, the digital-to-analog converting circuit 21c is expected to be high enough in precision to discriminate a difference equivalent to the least significant bit of the 6-bit digital output signal, and the 3-bit digital-to-analog converting circuit 21c according to the present invention is available for the 6-bit analog-to-digital converting unit.

As will be appreciated from the foregoing description, the present invention achieves an improved linearity by virtue of the decoding means alternately activating a constant-current cell for a standard current and a combination of constant-current cells for large and small currents.

Although particular embodiments of the present invention have been shown and described, it will be obvious to those skilled in the art that various changes and modifications may be made without departing from the spirit and scope of the present invention. For example, a digital-to-analog converting unit according to the present invention may form a part of another integrated circuit such as, for example, a microprocessor, a semi-custom made integrated circuit or a full-custom made integrated circuit, and another selecting order of the constant-current cells may be employed if the constant-current cells in a matrix irregularly increase the individual unit currents. The decoding circuit incorporated in the embodiment described hereinbefore is responsive to a 3-bit digital signal, however, a decoding circuit according to the present invention may be supplied with a digital input signal consisting of more than 3-bits.

What is claimed is:

1. A digital-to-analog converting unit comprising:
  a) a plurality of constant-current cells arranged in rows and columns, said plurality of constant-current cells respectively producing unit currents broken down into large currents, standard currents and small currents, and
  b) decoding means responsive to a digital input signal and selectively allowing said constant-current cells to produce said unit currents in such a manner that one of said large currents and one of said small currents simultaneously flow instead of one of said standard current previously selected upon increment of said digital input signal and one of said standard currents flows together with said one of said large currents and said one of said small currents upon next increment of said digital input signal, thereby linearly increasing the total amount of unit currents forming an analog output signal.

2. A digital-to-analog converting unit as set forth in claim 1, in which one of said columns has one of said constant-current cells producing said standard current, a first predetermined number of constant-current cells producing said large currents, respectively, and a second predetermined number of constant-current cells producing said small currents, respectively, said decoding means firstly selecting said one of said constant-current cells, said decoding means secondly selecting one of said first predetermined number of constant-current cells and one of said second predetermined number of constant-current cells instead of said one of said constant-current cells upon increment of said digital input signal, said decoding means thirdly selecting said one of said first predetermined number of constant-current cells, said one of said second predetermined number of constant-current cells and said one of said constant-current cells upon further increment of said digital input signal.

3. A digital-to-analog converting unit as set forth in claim 2, in which said digital-to-analog converting unit further comprises latching means coupled between said decoding means and said plurality of constant-current cells.

4. A digital-to-analog converting unit comprising:
a) a plurality of constant-current cells arranged in rows and columns, said plurality of constant-current cells respectively producing unit currents broken down into large currents, standard currents and small currents, and
b) decoding means responsive to a digital input signal and selectively allowing said constant-current cells to produce said unit currents in such a manner that one of said large currents and one of said small currents flow instead of one of said standard current previously selected upon increment of said digital input signal and one of said standard currents flows together with said one of said large currents and said one of said small currents upon next increment of said digital input signal, thereby linearly increasing the total amount of unit currents forming an analog output signal, wherein said digital-to-analog converting unit is responsive to an n bit digital input signal and forms a part of an analog-to-digital converting unit for producing a 2n bit digital output signal, said analog-to-digital converting unit further comprises a first analog-to-digital converting circuit responsive to an analog input signal for producing a first n bit digital output signal supplied to said digital-to-analog converting unit, a sample-and-hold circuit supplied with said analog input signal for producing a sampled signal, a subtracter for subtracting the value indicated by said analog output signal supplied from said digital-to-analog converting unit from the value represented by said sampled signal for producing a difference signal, and a second analog-to-digital converting circuit responsive to said difference signal for producing a second n bit digital signal, said first and second n bit digital signals forming in combination said 2n bit digital output signal.

5. A digital-to-analog converting unit comprising:
a) a plurality of constant-current cells arranged in rows and columns, said plurality of constant-current cells respectively producing unit currents broken down into large currents, standard currents and small currents,
b) a first decoding circuit responsive to a first part of an digital input signal and producing a first decoded signal for selectively activating said columns,
c) a first latching circuit temporarily storing said first decoded signal and supplying to said plurality of constant-current cells,
d) a second decoding circuit responsive to a second part of said digital input signal and producing a second decoded signal for selectively allowing said constant-current cells to flow said unit currents in such a manner that one of said large currents and one of said small currents simultaneously flow instead of one of said standard current previously selected upon increment of said second part of said digital input signal from an odd number to an even number for linearly increasing the amount of total current forming an analog output signal, and
e) a second latching circuit temporarily storing said second decoded signal for supplying to said plurality of constant-current cells.

6. A digital-to-analog converting unit comprising:
a) a plurality of columns, each of said columns being implemented by n elements each having an electric variable proportional to dimensions thereof forming a part of an integrated circuit, said n elements being assigned to first to n-positions, respectively, and
b) a decoding unit selectively activating said n elements, said decoding unit selecting one of said n elements at the (n/2) position or at the {(n/2)+1} position, or said element and elements evenly located on both sides of said element when a digital input signal is indicative of an odd number, said decoding unit further selecting said elements evenly located on both sides of said element without selection of said element located at the (n/2) position or at the {(n/2)+1) position when said digital input signal is indicative of an even number, said electric variables of activated elements being merged with one another so as to form an analog output signal.

* * * * *